United States Patent
Fang et al.

(10) Patent No.: US 7,048,603 B2
(45) Date of Patent: May 23, 2006

(54) METHOD FOR MANUFACTURING ORGANIC LIGHT-EMITTING DIODES

(75) Inventors: Yean-Kuen Fang, Tainan (TW); William Lee, Taichung (TW); Jyh-Jier Ho, Kaohsiung (TW); Shyh-Fann Ting, Kaohsiung (TW); Shih-Fang Chen, Tainan (TW); Hsin-Che Chiang, Kaohsiung (TW)

(73) Assignee: National Cheng Kung University, (TW)

( * ) Notice: Subject to any disclaimer, the term of this patent is extended or adjusted under 35 U.S.C. 154(b) by 169 days.

(21) Appl. No.: 10/720,058

(22) Filed: Nov. 25, 2003

(65) Prior Publication Data
US 2005/0101218 A1 May 12, 2005

(30) Foreign Application Priority Data
Dec. 9, 2002 (TW) ................. 91135597 A

(51) Int. Cl.
*H01J 9/22* (2006.01)
*H01J 1/62* (2006.01)
(52) U.S. Cl. ..................................... 445/24
(58) Field of Classification Search .......... 445/9, 445/10, 11, 13, 16, 24; 313/503, 504, 505, 313/506; 438/99; 439/894
See application file for complete search history.

(56) References Cited

U.S. PATENT DOCUMENTS

| | | | |
|---|---|---|---|
| 5,874,803 A * | 2/1999 | Garbuzov et al. ........... 313/506 |
| 5,998,803 A * | 12/1999 | Forrest et al. ................ 257/40 |
| 6,402,579 B1 * | 6/2002 | Pichler et al. ................ 445/24 |
| 2001/0002279 A1 * | 5/2001 | Forrest et al. .......... 427/255.26 |
| 2002/0070385 A1 * | 6/2002 | Yamagata ..................... 257/93 |
| 2002/0098378 A1 * | 7/2002 | Kim et al. ................... 428/690 |
| 2002/0157596 A1 * | 10/2002 | Stockman et al. ............. 117/2 |
| 2002/0160553 A1 * | 10/2002 | Yamanaka et al. .......... 438/149 |
| 2003/0018097 A1 * | 1/2003 | O'Neill et al. ................ 522/1 |
| 2003/0030059 A1 * | 2/2003 | Shi et al. ...................... 257/79 |

* cited by examiner

Primary Examiner—Joseph Williams
Assistant Examiner—Christopher M. Raabe
(74) Attorney, Agent, or Firm—Baker & Hostetler LLP

(57) ABSTRACT

A method for manufacturing organic light-emitting diodes (OLEDs) is disclosed, by adding nitrogen ($N_2$) into the material of a hole transport layer (HTL) and evaporating the nitrogen and the material of the hole transport layer while growing the hole transport layer, so as to dope nitrogen molecules into the hole transport layer. In the hole transport layer, the nitrogen molecules are impurities of higher energy level, and are used to catch holes while the holes transports and trap the holes in the hole transport layer, thereby obtaining an object of improving the luminance efficiency of the organic light-emitting diodes with lower cost.

40 Claims, 5 Drawing Sheets

METHOD FOR MANUFACTURING ORGANIC LIGHT-EMITTING DIODES

FIELD OF THE INVENTION

The present invention relates to a method for manufacturing organic light-emitting diodes (OLEDs), and more particularly, to a process of organic light-emitting diodes that can effectively enhance the luminance current efficiency and the luminous Flux Power Efficiency.

BACKGROUND OF THE INVENTION

Referring to FIG. 1, FIG. 1 illustrates a cross-sectional view of a conventional organic light-emitting diode. A conventional organic light-emitting diode 100 includes a transparent substrate 102. An anode 104 is formed on the substrate 102, and a hole transport layer (HTL) 106 and an electron transport layer (ETL) 108 are formed to stack on the anode 104 in sequence. A cathode 110 is then formed on the electron transport layer 108. A carrier transport layer composed of the hole transport layer 106 and the electron transport layer 108 is located between the anode 104 and the cathode 110 for transporting holes and electrons. The electron transport layer 108 is usually called an illuminant layer.

In an organic material layer, the hole is about ten times as mobile as the electron, and the interfacial energy barrier faced by the hole is smaller than that faced by the electron, so that when large number of holes inject into the electron transport layer 108, only a few electrons reach the electron transport layer 108, resulting in the amount unbalance of the electrons and the holes. A large number of holes cannot be combined with electrons, and thus the luminance current efficiency and the luminous flux power efficiency of the organic light-emitting diode 100 are reduced.

Presently, the research of organic light-emitting diode in promoting luminance efficiency generally gives more emphasis on improving the injection efficiency of electrons and heavy doping the electron transport layer with organic impurities. In the aspect of improving the injection efficiency of electrons, an alloy layer of low work function is added between a cathode and an electron transport layer to increase the number of injected and transported electrons after the electron transport layer made of organic material is formed, so as to achieve the objective of improving the injection efficiency of electrons. In the aspect of heavy doping the electron transport layer with organic impurities, organic impurities, such as tetraphenylporphyrin (TPP), are doped into the electron transport layer, and the organic impurities are used to catch excitations and to block these excitations from moving to the cathode and being eliminated. Therefore, the excitations falls to a steady state energy level from an exciting state to increase chances for emitting light, so as to achieve an objective of enhancing luminance efficiency of the organic light-emitting diode.

However, although the luminance efficiency of an organic light-emitting diode can be enhanced with an alloy layer of low work function added between a cathode and an electron transport layer, yet the number of process steps is increased and process is more complicated, thus increasing the process cost. Additionally, although the luminance efficiency of an organic light-emitting diode can also be enhanced by heavy doping the electron transport layer with organic impurities, yet the organic impurities, such as tetraphenylporphyrin, are very expensive, thus greatly increasing process cost. Therefore, those two methods for improving luminance efficiency of the organic light-emitting diode mentioned above are not benefit for real production.

SUMMARY OF THE INVENTION

According to a conventional organic light-emitting diode, the amount unbalance is between positive carriers and negative carriers, so the luminance efficiency of the organic light-emitting diode is reduced due to the ineffective recombination rate of the positive carriers and the negative carriers.

Therefore, one objective of the present invention is to provide a method for manufacturing an organic light-emitting diode, by adding nitrogen gas ($N_2$) when a hole transport layer is grown, so as to dope nitrogen molecules into the hole transport layer. The nitrogen molecules in the hole transport layer have a higher energy level, so the holes can be trapped in the hole transport layer, thereby increasing the recombination rate of electrons and holes, reducing the waste of holes, and enhancing luminance efficiency of the organic light-emitting diode.

Another objective of the present invention is to provide a method for manufacturing an organic light-emitting diode by using a hole transport layer formed by simultaneously evaporating the material of the hole transport layer and nitrogen gas to dope nitrogen molecules into the hole transport layer and form high energy level impurities. As a result, most holes are confined in the hole transport layer to decrease the amount of the holes transporting to the electron transport layer. Therefore, the potential of the hole transport layer can be increased to make a greater portion of voltage between two ends of the organic light-emitting diode be across the electron transport layer, and increase an injection electric field of electrons. The amount of electrons and the amount of holes are more balanced to enhance luminance efficiency of the organic light-emitting diode.

According to the aforementioned objectives, the present invention further provides a method for manufacturing an organic light-emitting diode, the method comprising: providing a substrate into a chamber, wherein the substrate is a transparent substrate, and the material of the substrate can be a transparent material, such as glass, silicon and plastics; forming an anode on the substrate, wherein the step of forming the anode can use a sputtering method, an evaporation method, an e-gun evaporation method, a spin-coating method and a chemical vapor deposition method, and the anode can be, for example, an indium tin oxide (ITO) transparent electrode or an indium zinc oxide (IZO) transparent electrode; forming a hole transport layer on the anode, wherein the step of forming the hole transport layer comprises adding a reaction gas, and the reaction gas forms a plurality of impurities to trap holes; forming an electron transport layer on the hole transport layer, wherein the material of the electron transport layer can be an organic material having an electron transport function, such as aluminum tris-(8-hydroxyquinoline) [$Alq_3$]; and forming a cathode on the electron transport layer, wherein the material of the cathode can be compound metal or metal, such as aluminum (Al).

The reaction gas added when growing the hole transport layer can be nitrogen with high purity, or $NH_3$, $N_2O$, NO, and $NO_2$. The material of the hole transport layer be an organic material having a hole transport function, such as N,N'-diphenyl-N,N'-bis(3-methyl-phenyl)-1,1'biphenyl-4,4'diamine (TPD).

A reaction gas, that can form impurities of high energy level in the hole transport layer, can be added and be simultaneously evaporated with the material of the hole transport layer, and holes are caught by the impurities of high energy level during the transport process of the holes and trapped in the hole transport layer, so that the effective recombination rate of the electrons and the holes can be effectively enhanced. Therefore, the objective of improving luminance efficiency of the organic light-emitting diode can be achieved with low process cost.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a method for manufacturing an organic light-emitting diode, by adding a reaction gas that can form impurities with high energy level in a hole transport layer when growing the hole transport layer. These impurities with high energy level can confine holes in the hole transport layer, so as to increase effective recombination rate of electrons and holes injected into the electron transport layer, thereby achieving an objective of enhancing luminance efficiency with increasing process cost load. In order to make the illustration of the present invention more explicitly and completely, the following description and the drawings from FIG. 2 to FIG. 6 are stated.

Figure 1:
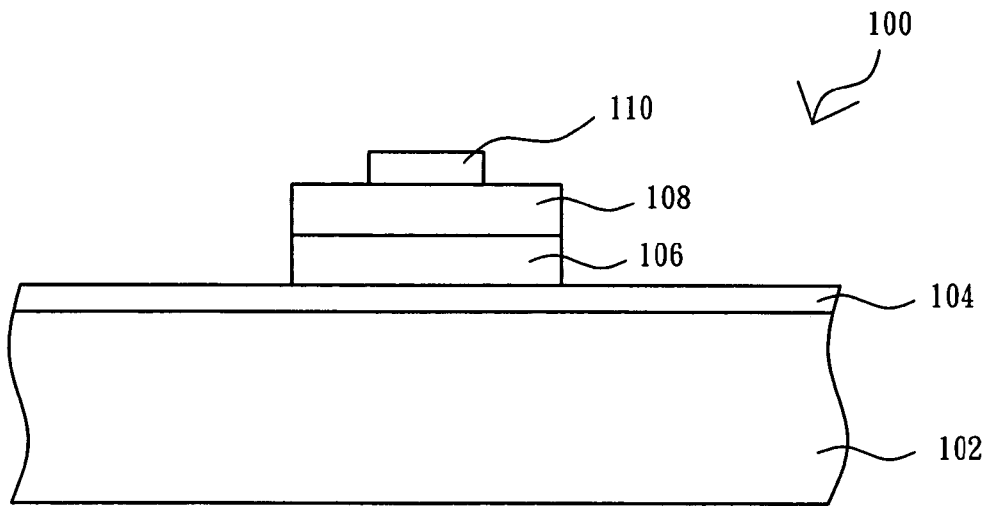
FIG. 1 illustrates a cross-sectional view of a conventional organic light-emitting diode.
Figure 2:
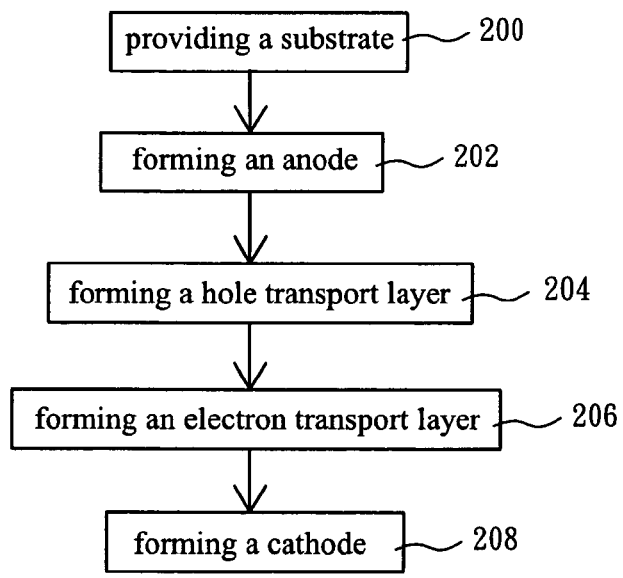
FIG. 2 illustrates a flowchart showing a process for manufacturing an organic light-emitting diode in accordance with a preferred embodiment of the present invention.

Referring to FIG. 2, FIG. 2 illustrates a flowchart showing a process for manufacturing an organic light-emitting diode in accordance with a preferred embodiment of the present invention. First, in step 200, a transparent substrate is provided into a chamber, wherein the material of the substrate can be, for example, glass, silicon and plastics. Next, in step 202, an anode is formed on the substrate by a sputtering method, an evaporation method, an e-gun evaporation method, a spin-coating method or a chemical vapor deposition method. The anode can be a transparent electrode, and the material of the anode can be, for example, indium tin oxide or indium zinc oxide. Then, organic materials of a hole transport layer and an electron transport layer are deposed into the chamber. The material of the hole transport layer can be an organic material having a hole transport function, such as N,N'-diphenyl-N,N'-bis(3-methyl-phenyl)-1,1'biphenyl-4,4'diamine, and the material of the electron transport layer can be the one having an electron transport function, such as aluminum tris-(8-hydroxyquinoline).

Then, in step 204, the chamber is vacuumed, so as to make the chamber with a pressure between $1\times10^{-8}$ torr and $1\times10^{-3}$ torr. The pressure of the chamber is preferably controlled at about $1\times10^{-5}$ torr. At this time, the pressure of the chamber is at an initial growth pressure of the hole transport layer. A reaction gas is added into the chamber, and the pressure of the chamber is controlled between $1\times10^{-7}$ torr and $1\times10^{-2}$ torr, and preferably, $1\times10^{-4}$ torr. The material of the reaction gas is a material that can form impurities with high energy level in the hole transport layer, such as $N_2$, $NH_3$, $N_2O$, $NO$ and $NO_2$, and preferably, $N_2$ with high purity. The flow rate of the reaction gas injected into the chamber is preferably controlled between 1 sccm and 20 sccm. After the reaction gas is injected into the chamber, the material of the hole transport layer and the reaction gas are immediately evaporated at the same time by an evaporation method. The evaporation step is preformed for 100 seconds to 5 minutes, so as to form the hole transport layer on the anode. The reaction gas and the material of the hole transport layer are evaporated simultaneously, so the molecules of the reaction gas form impurities in the hole transport layer.

After the hole transport layer is formed, the chamber is vacuumed to a pressure between $1\times10^{-8}$ torr and $1\times10^{-3}$ torr, and preferably, about $1\times10^{-5}$ torr. Next, the electron transport layer is grown, and the pressure of the chamber at this moment is also called a growth pressure of the electron transport layer. Then, in step 206, the electron transport layer is formed on the hole transport layer by, for example, an evaporation method. Preferably, the step for growing electron transport layer is performed for 100 seconds to 6 minutes.

Subsequently, in step 208, the pressure of the chamber is controlled between $1\times10^{-8}$ torr and $1\times10^{-2}$ torr, and a cathode is formed on the electron transport layer, for example, by an evaporation method to complete the organic light-emitting diode. The step for growing cathode is preferably performed for 1 second to 1 minute, and the material of the cathode can be compound metal or metal, such aluminum.

Figure 3:
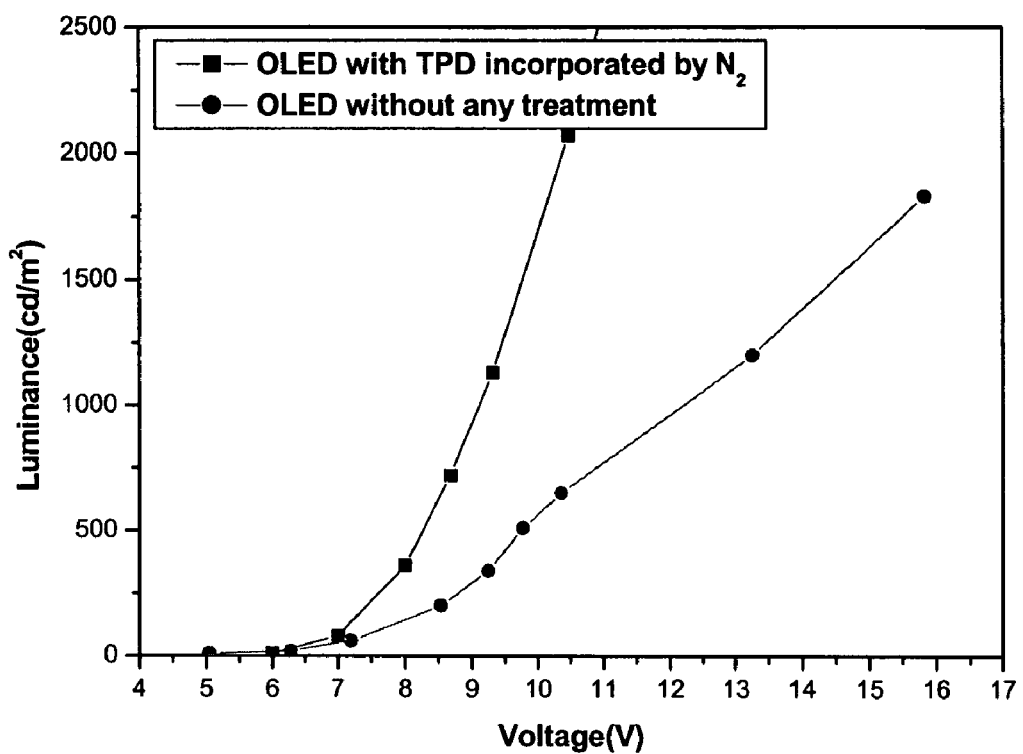
FIG. 3 illustrates a diagram of curves showing respectively the relationships between luminance and voltage of a conventional organic light-emitting diode and an organic light-emitting diode in accordance with a preferred embodiment of the present invention.
Figure 4A:
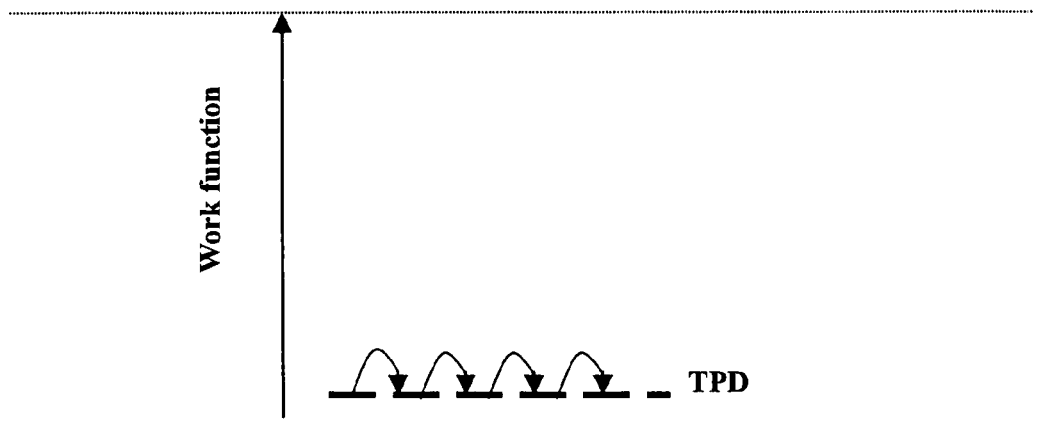
FIG. 4a illustrates a schematic diagram showing holes transporting in an organic material layer in a conventional organic light-emitting diode.
Figure 4B:
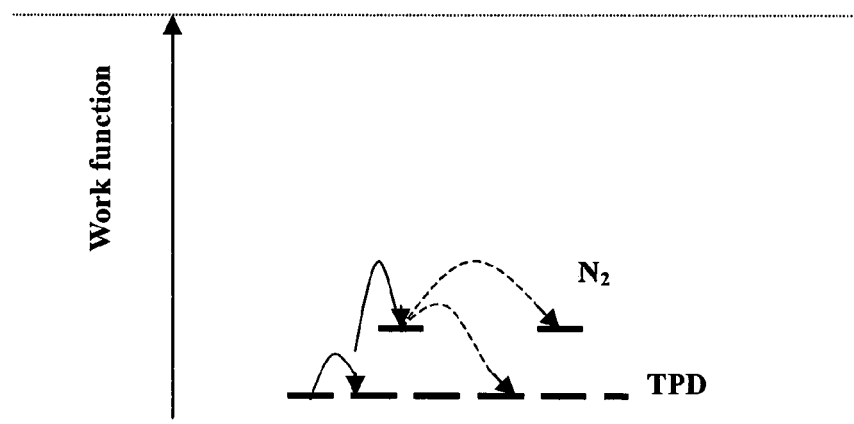
FIG. 4b illustrates a schematic diagram showing holes transporting in an organic material layer in an organic light-emitting diode according to a preferred embodiment of the present invention.

Referring to FIG. 3, FIG. 3 illustrates a diagram of curves showing respectively the relationships between luminance and voltage of a conventional organic light-emitting diode and an organic light-emitting diode in accordance with a preferred embodiment of the present invention. From the diagram of curves showing the relationships between luminance and voltage in FIG. 3, it can be clearly known that the luminance of the organic light-emitting diode, that is manufactured by adding nitrogen gas while growing the hole transport layer, is much greater than that of a conventional organic light-emitting diode. The aforementioned phenomenon is illustrated by referring to FIG. 4a and FIG. 4b, wherein FIG. 4a illustrates a schematic diagram showing holes transporting in an organic material layer in a conventional organic light-emitting diode, and FIG. 4b illustrates a schematic diagram showing holes transporting in an organic material layer in an organic light-emitting diode according to a preferred embodiment of the present invention. As shown in FIG. 4a, in a conventional organic light-emitting diode, holes in the organic material layer transported by a hopped transport method. However, as shown in FIG. 4b, the molecules of the reaction gas, such as nitrogen molecules, doped in the hole transport layer composed of organic material have higher energy level, so that high energy traps are formed. When the holes transport to the position of the nitrogen molecules with high energy level, the nitrogen molecules with high energy level catch the holes and block the transmission of the holes. A large number of holes are confined in the hole transport layer, so as to decrease the number of the holes injected into the electron transport layer. Therefore, the amount of electrons and the amount of the holes in the electron transport layer are more balanced; the waste of holes is reduced; the recombination rate of electrons and holes is increased; and the objective of enhancing luminance efficiency of the organic light-emitting diode is achieved.

Because a large number of holes are confined in the hole transport layer, the potential of the hole transport layer itself is increased to make a greater portion of voltage between two ends of the organic light-emitting diode be across the electron transport layer, and to increase the intensity of electric field injecting more electrons into the electron transport layer. Therefore, the amount of electrons injected into the electron transport layer is greatly increased to make the amount of electrons and the amount of holes be more balanced, thus achieving the objective of enhancing the luminance efficiency of the organic light-emitting diode.

Figure 5:
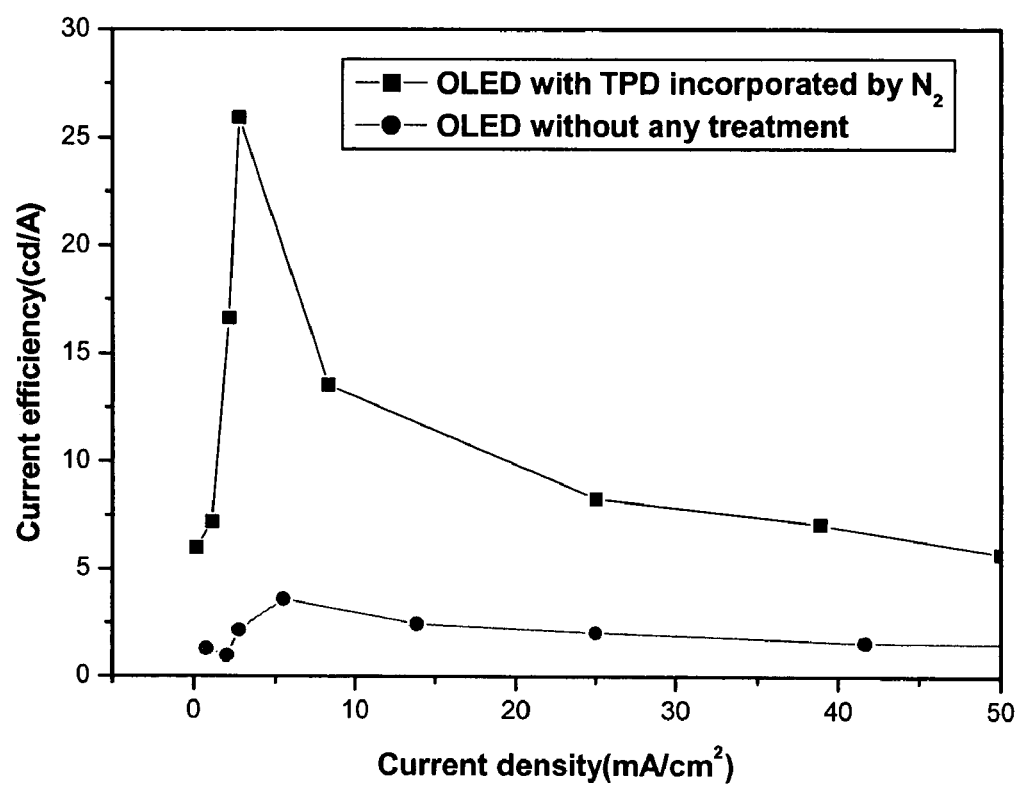
FIG. 5 illustrates a diagram of curves showing respectively the relationships between luminance current efficiency and current density of a conventional organic light-emitting diode and an organic light-emitting diode in accordance with a preferred embodiment of the present invention.
Figure 6:
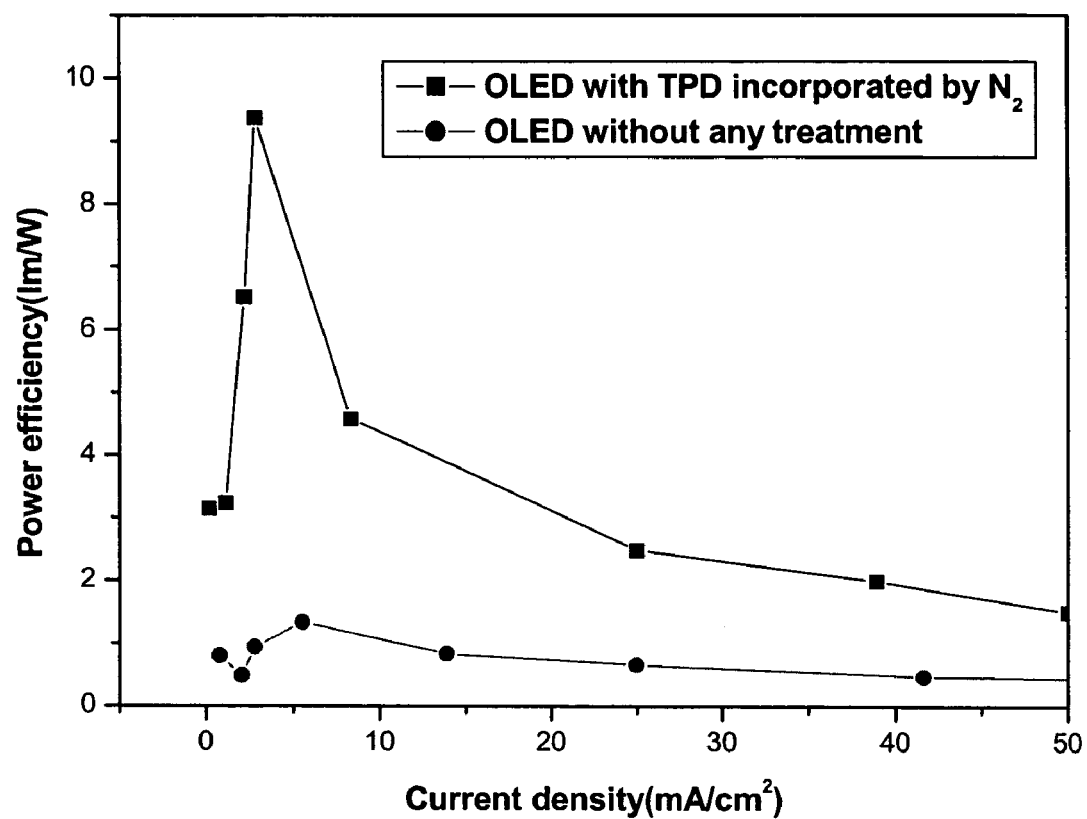
FIG. 6 illustrates a diagram of curves showing respectively the relationships between luminance power efficiency and current density of a conventional organic light-emitting diode and an organic light-emitting diode in accordance with a preferred embodiment of the present invention.

Referring to FIG. 5 and FIG. 6, FIG. 5 illustrates a diagram of curves showing respectively the relationships between luminance current efficiency and current density of a conventional organic light-emitting diode and an organic light-emitting diode in accordance with a preferred embodiment of the present invention, and FIG. 6 illustrates a diagram of curves showing respectively the relationships between luminance power efficiency and current density of a conventional organic light-emitting diode and an organic light-emitting diode in accordance with a preferred embodiment of the present invention. In FIG. 5, it is apparent that luminance current efficiency of the organic light-emitting diode of the present invention is up to 27 cd/A and is about 8 times as much as the luminance current efficiency of a conventional organic light-emitting diode when operated in a low current density. In addition, in FIG. 6, it is apparent that luminous flux power efficiency of the organic light-emitting diode of the present invention is up to 9.5 lm/W and is about 7 times as much as the luminous flux power efficiency of a conventional organic light-emitting diode when operated in a low current density. According to the aforementioned illustration, the luminance efficiency of the organic light-emitting diode can be effectively enhanced with the application of the organic light-emitting diode manufactured by using the method of the present invention.

According to the aforementioned description, one advantage of the present invention is that the luminance efficiency of an organic light-emitting diode can be substantially enhanced only by adding gas that can forms impurities of high energy level in the hole transport layer, such as nitrogen, when the hole transport layer is grown. The process is quite easy, and additional process steps are not needed.

Another advantage of the present invention is that: compared with expensive conventional techniques of doping organic impurities or adding an additional alloy layer with low work function, the present invention only needs to add cheap reaction gas, such as nitrogen, when the hole transport layer is grown, and the luminance efficiency of the organic light-emitting diode of the present invention can gain more noticeable improvement than that of using the conventional techniques. Therefore, the present invention has advantages of low production cost and high produce competition.

Still another advantage of the present invention is that: because the luminance efficiency of the organic light-emitting diode manufactured by using the method of the present invention is great, the organic light-emitting diode can be applied in high-brightness produce.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing an organic light-emitting diode, comprising:
   providing a substrate into a chamber;
   forming an anode on the substrate;
   forming a hole transport layer on the anode, wherein the step of forming the hole transport layer comprises adding a reaction gas, and the reaction gas forms a plurality of impurities in the hole transport layer to trap holes;
   forming an electron transport layer on the hole transport layer, and the step of forming the electron transport layer is performed without using the reaction gas; and
   forming a cathode on the electron transport layer.

2. The method for manufacturing an organic light-emitting diode according to claim 1, wherein the substrate is a transparent substrate.

3. The method for manufacturing an organic light-emitting diode according to claim 1, wherein the material of the substrate is selected from the group consisting of glass, silicon and plastics.

4. The method for manufacturing an organic light-emitting diode according to claim 1, wherein the anode is an indium tin oxide (ITO) transparent electrode.

5. The method for manufacturing an organic light-emitting diode according to claim 1, wherein the anode is an indium zinc oxide (IZO) transparent electrode.

6. The method for manufacturing an organic light-emitting diode according to claim 1, wherein the step of forming the anode is performed by using a method selected from the group consisting of a sputtering method, an evaporation method, an e-gun evaporation method, a spin-coating method and a chemical vapor deposition method.

7. The method for manufacturing an organic light-emitting diode according to claim 1, wherein the material of the hole transport layer is an organic material having a hole transport function.

8. The method for manufacturing an organic light-emitting diode according to claim 1, wherein the material of the hole transport layer comprises N,N'-diphenyl-N,N'-bis(3-methyl-phenyl)-1,1'biphenyl-4,4'diamine (TPD).

9. The method for manufacturing an organic light-emitting diode according to claim 1, wherein the material of the electron transport layer is an organic material having an electron transport function.

10. The method for manufacturing an organic light-emitting diode according to claim 1, wherein the material of the electron transport layer comprises aluminum tris-(8-hydroxyquinoline) [$Alq_3$].

11. The method for manufacturing an organic light-emitting diode according to claim 1, wherein the material of the cathode is selected from the group consisting of metal and compound metal.

12. The method for manufacturing an organic light-emitting diode according to claim 1, wherein the material of the cathode is aluminum.

13. The method for manufacturing an organic light-emitting diode according to claim 1, wherein the step of forming the hole transport layer further comprises controlling an initial growth pressure of the hole transport layer between $1\times10^{-8}$ torr and $1\times10^{-3}$ torr.

14. The method for manufacturing an organic light-emitting diode according to claim 1, wherein in the step of forming the hole transport layer, further comprises controlling a pressure of the chamber between $1\times10^{-7}$ torr and $1\times10^{-2}$ torr when adding the reaction gas.

15. The method for manufacturing an organic light-emitting diode according to claim 1, wherein the step of forming the hole transport layer is performed for 100 seconds to 5 minutes.

16. The method for manufacturing an organic light-emitting diode according to claim 1, wherein the reaction gas is selected from the group consisting of $N_2$, $NH_3$, $N_2O$, NO and $NO_2$.

17. The method for manufacturing an organic light-emitting diode according to claim 1, wherein a flow rate of the reaction gas is between 1 sccm and 20 sccm.

18. The method for manufacturing an organic light-emitting diode according to claim 1, wherein the step of forming the electron transport layer further comprises controlling a growth pressure of the electron transport layer between $1\times10^{-8}$ torr and $1\times10^{-3}$ torr.

19. The method for manufacturing an organic light-emitting diode according to claim 1, wherein the step of forming the electron transport layer is performed for 100 seconds to 6 minutes.

20. The method for manufacturing an organic light-emitting diode according to claim 1, wherein the step of forming the cathode further comprises controlling a pressure of the chamber between $1\times10^{-8}$ torr and $1\times10^{-2}$ torr.

21. The method for manufacturing an organic light-emitting diode according to claim 1, wherein the step of forming the cathode is performed for 1 second to 1 minute.

22. A method for manufacturing an organic light-emitting diode, comprising:
   providing a substrate into a chamber, wherein an anode is formed on the substrate;
   performing an evaporation step to form a hole transport layer on the anode, wherein the evaporation step comprises evaporating the material of the hole transport layer and a reaction gas to make the reaction gas form a plurality of impurities in the hole transport layer to confine holes;
   forming an electron transport layer on the hole transport layer, and the step of forming the electron transport layer is performed without using the reaction gas; and
   forming a cathode on the electron transport layer.

23. The method for manufacturing an organic light-emitting diode according to claim 22, wherein the substrate is a transparent substrate, and the material of the substrate is selected from the group consisting of glass, silicon and plastics.

24. The method for manufacturing an organic light-emitting diode according to claim 22, wherein the anode is selected from the group consisting of an indium tin oxide transparent electrode and an indium zinc oxide transparent electrode.

25. The method for manufacturing an organic light-emitting diode according to claim 22, wherein the step of forming the anode is performed by using a method selected from the group consisting of a sputtering method, an evaporation method, an e-gun evaporation method, a spin-coating method and a chemical vapor deposition method.

26. The method for manufacturing an organic light-emitting diode according to claim 22, wherein between the step of providing the substrate and the evaporation step, the method for manufacturing an organic light-emitting diode further comprises performing a pump step to make the chamber have an initial growth pressure of the hole transport layer.

27. The method for manufacturing an organic light-emitting diode according to claim 26, wherein the initial growth pressure is between $1\times10^{-8}$ torr and $1\times10^{-3}$ torr.

28. The method for manufacturing an organic light-emitting diode according to claim 22, wherein the material of the hole transport layer is an organic material having a hole transport function.

29. The method for manufacturing an organic light-emitting diode according claim 22, wherein the material of the hole transport layer comprises N,N'-diphenyl-N,N'-bis(3-methyl-phenyl)-1,1'biphenyl-4,4'diamine.

30. The method for manufacturing an organic light-emitting diode according to claim 22, wherein the material of the electron transport layer is an organic material having an electron transport function.

31. The method for manufacturing an organic light-emitting diode according to claim 22, wherein the material of the electron transport layer comprises aluminum tris-(8-hydroxyquinoline).

32. The method for manufacturing an organic light-emitting diode according to claim 22, wherein in the evaporation step, further comprises controlling a pressure of the chamber between $1\times10^{-7}$ torr and $1\times10^{-2}$ torr.

33. The method for manufacturing an organic light-emitting diode according to claim 22, wherein the evaporation step is performed for 100 seconds to 5 minutes.

34. The method for manufacturing an organic light-emitting diode according to claim 22, wherein the reaction gas is selected from the group consisting of $N_2$, $NH_3$, $N_2O$, NO and $NO_2$.

35. The method for manufacturing an organic light-emitting diode according to claim 22, wherein a flow rate of the reaction gas is between 1 sccm and 20 sccm.

36. The method for manufacturing an organic light-emitting diode according to claim 22, wherein the step of forming the electron transport layer further comprises controlling a growth pressure of the electron transport layer between $1\times10^{-8}$ torr and $1\times10^{-3}$ torr.

37. The method for manufacturing an organic light-emitting diode according to claim 22, wherein the step of forming the electron transport layer is performed for 100 seconds to 6 minutes.

38. The method for manufacturing an organic light-emitting diode according to claim 22, wherein the material of the cathode is selected from the group consisting of metal and compound metal.

39. The method for manufacturing an organic light-emitting diode according to claim 22, wherein the material of the cathode is aluminum.

40. The method for manufacturing an organic light-emitting diode according to claim 22, wherein the step of forming the cathode is performed for 1 second to 1 minute.

* * * * *